United States Patent
Wildrick et al.

(10) Patent No.: US 6,747,875 B2
(45) Date of Patent: Jun. 8, 2004

(54) SURFACE MOUNT POWER SUPPLIES FOR STANDARD ASSEMBLY PROCESS

(75) Inventors: Carl Milton Wildrick, Parker, TX (US); Gordon K. Y. Lee, Plano, TX (US)

(73) Assignee: Innoveta Technologies, Plano, TX (US)

( * ) Notice: Subject to any disclaimer, the term of this patent is extended or adjusted under 35 U.S.C. 154(b) by 0 days.

(21) Appl. No.: 09/964,130

(22) Filed: Sep. 25, 2001

(65) Prior Publication Data

US 2002/0191379 A1 Dec. 19, 2002

Related U.S. Application Data

(60) Provisional application No. 60/298,908, filed on Jun. 19, 2001.

(51) Int. Cl.[7] ................................................. H05K 1/14
(52) U.S. Cl. ..................... 361/736; 361/758; 361/770; 361/803
(58) Field of Search ................................. 361/736–737, 361/742, 758, 770, 803–804, 809–810, 752, 753, 704, 774; 439/66, 876; 174/138 G

(56) References Cited

U.S. PATENT DOCUMENTS

| 4,254,301 A | * | 3/1981 | Serino | 174/138 G |
|---|---|---|---|---|
| 4,362,904 A | * | 12/1982 | Schneider et al. | 174/138 G |
| 4,395,585 A | * | 7/1983 | Polcyn | 174/138 G |
| 5,107,330 A | * | 4/1992 | Dahringer | 257/718 |
| 5,150,282 A | * | 9/1992 | Tomura et al. | 174/35 MS |
| 5,303,123 A | * | 4/1994 | Chandler et al. | 174/135 |
| 5,666,270 A | * | 9/1997 | Matsuda et al. | 361/704 |
| 5,888,102 A | * | 3/1999 | Strickland | 439/698 |
| 5,969,952 A | * | 10/1999 | Hayashi et al. | 361/774 |
| 5,984,692 A | * | 11/1999 | Kumagai et al. | 439/66 |
| 6,189,203 B1 | | 2/2001 | Heinrich et al. | |
| 6,191,954 B1 | * | 2/2001 | Keidl et al. | 174/138 G |
| 6,356,447 B2 | * | 3/2002 | Scafidi | 361/710 |

* cited by examiner

Primary Examiner—Kamand Cuneo
Assistant Examiner—Tuan Dinh
(74) Attorney, Agent, or Firm—David W Carstens; Carstens Yee & Cahoon LLP

(57) ABSTRACT

This improved surface mount power supply can withstand the rigors of the manufacturing process and still create sturdy and robust connection to a user's circuit card. The open frame power module uses a U-shaped or T-shaped interconnect rather than a spherical interconnect. In one embodiment, the U-shaped interconnect can have a hole through one surface to allow the wicking of solder. The wicked solder provides a sturdier connection that is more likely to survive subsequent reflow processes. The power module is also built on a thicker FR4 board. The thicker board is less likely to warp during subsequent heating.

16 Claims, 8 Drawing Sheets

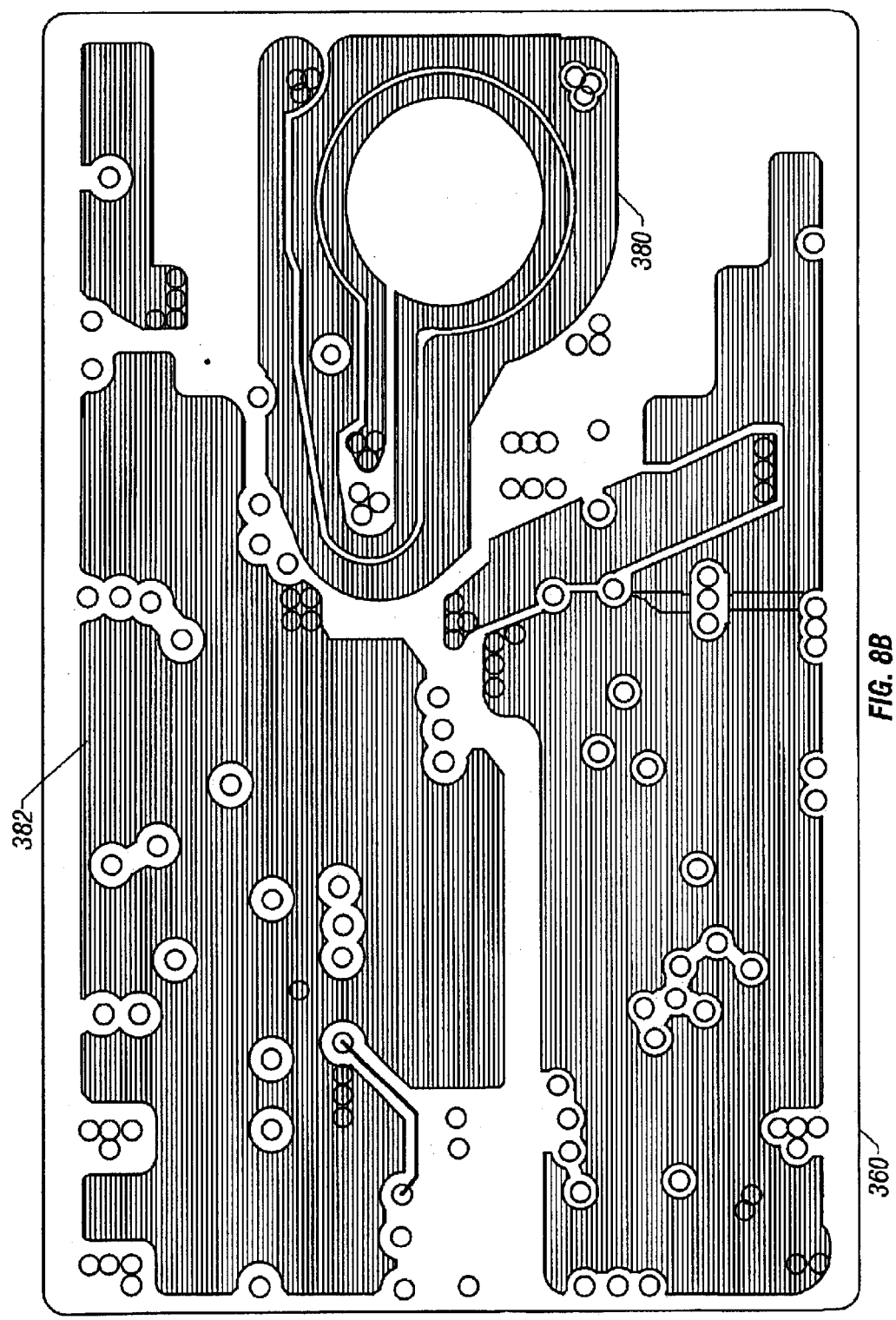

SURFACE MOUNT POWER SUPPLIES FOR STANDARD ASSEMBLY PROCESS

RELATED APPLICATION

The present invention is a non-provisional filing based on Provisional Application Ser. No. 60/298,908 filed on Jun. 19, 2001 and entitled "Design of Surface Mount Power Supplies For Standard Assembly Processes."

BACKGROUND OF THE INVENTION

1. Technical Field of the Invention

The present invention relates generally to a surface mountable power supply and specifically to an interconnect and method of interconnection that provides a robust physical and electrical connection between the power supply module and an end user circuit card.

2. Prior Art to the Invention

A distributed power architecture employs many small board mounted power supply modules in place of a few larger and more centralized power supply modules. A power supply module is mounted directly to the end user's circuit card that requires the power. A need exists for a method of placing the power supply module on the end user circuit card in an economical fashion. In other words, the method should minimize the number of manufacturing steps required for the placement. However, the method must also provide a robust physical connection to the end user circuit card, so that subsequent handling does not dislodge it. The connections between the power module and the end user's circuit board must also be robust enough to handle high current loads.

Conventional power supply modules may be constructed as a unitary, encapsulated package, having one or more rows of leads, with the power supply module enclosed in a metal case. The leads allow the module to be coupled to a circuit card while the metal case contains attachment mounts for an external heat sink. The power supply module often includes one or more power devices (e.g., transistors or diodes) in thermal communication with the metal case, one or more magnetic devices (e.g., transformers or inductors) providing electrical isolation and energy storage and one or more circuit boards containing passive electronic devices to provide, among other things, control and monitoring functions.

Power devices and magnetic devices that require thermal management due to their high power dissipation may be mounted on a metal circuit board employing insulated metal substrate technology, for example, a THERMAL CLAD substrate manufactured by the Bergquist Corporation of Minneapolis, Minn. Electronic devices such as passive devices that do not require thermal management may be mounted on either the metal circuit board or on a conventional FR4 circuit board. The FR4 circuit board may then be mechanically and electrically coupled to the metal circuit board to facilitate electrical communication and power flow between the various parts of the power supply module.

The leads of the power supply module are mechanically and electrically coupled to either the FR4 circuit board or the metal circuit board. The power supply module is typically encapsulated in a plastic or metal case that is filled with an encapsulant to protect the internal components of the power supply module from contaminants and perhaps to improve heat flow between the internal components and the case.

The aforementioned encapsulated package design, however, suffers from a number of deficiencies. At least two circuit boards, the metal circuit board and the FR4 circuit board, are required to accommodate the constituent components of the power supply module. Employing multiple circuit boards increases both complexity and cost of the power supply module. Further, the encapsulation can place additional stress on the component solder joints, leading to premature joint failure.

Conventional encapsulated and open frame power supply modules are often mounted to the end user's circuit card via through-hole pins. For example, FIGS. 1 and 2 illustrates a through-hole pin connection. An end user's circuit card typically contains a large number of surface mount components. In fact, the power supply module is often the only through-hole mounted component on the circuit card. A separate or additional manufacturing step is thus required to mount the power supply module to the circuit card, thereby increasing the complexity and overall cost of the electronic assembly incorporating the circuit card. FIG. 1 illustrates an exploded isometric view of prior art power supply 100. The power supply 100 advantageously employs planar magnetic devices (one of which is designated 130) to decrease the size of the power supply 100. The power supply 100 includes a conventional FR4 circuit board 110 containing conductive traces for interconnecting electronic devices mounted thereto. The planar magnetic device 130 has windings 120 formed from a portion of the conductive traces. A core of the planar magnetic device 130 (including first and second core halves 133, 136) is disposed through apertures of the circuit board 110 and proximate the windings 120.

The power supply 100 further includes a metal case 140 having a base and four side walls, thus forming a five-sided reservoir to receive the circuit board 110 therein. Alternatively, the metal case 140 may be formed without one or more of the side walls to allow air flow through the power supply 100. The air flow may advantageously assist in dissipating heat from the constituent components of the power supply 100. In the illustrated embodiment, the metal case 140 is an insulated metal substrate such as a THERMAL CLAD substrate, having an electrically insulating layer 145 and an electrically conductive layer 150, in addition to the metal layer. Portions of the electrically conductive layer 150 may be removed, allowing the remaining portions to form conductive traces for interconnecting the electronic devices. The metal case 140 further has attachment points for coupling to an external heat sink. In the illustrated embodiment, the attachment points are internally threaded posts (one of which is designated 185) protruding from the metal case 140.

The power supply 100 further includes a plurality of semiconductor power devices (e.g., a switching device, one of which is designated 160) having a body coupled in thermal communication with the metal case 140 and terminals (one of which is designated 165) couplable to the conductive traces of the circuit board 110. The power device 160 may be soldered to the metal case 140 via a conductive pad 155, with the solder joint providing thermal coupling between the power device 160 and the metal case 140. Soldering the power device 160 to the metal case 140 enhances an automatic assembly (e.g., for repeatability purposes) of the power supply 100.

The power supply 100 further includes an encapsulant 170, located within the reservoir, that provides a thermally conductive path to direct heat generated by the electrical components of the power supply 100 towards the metal case 140. The encapsulant 170 may be located in only a portion of the reservoir or may substantially fill the reservoir.

FIG. 2 illustrates a side cut away view of the power supply 100 of FIG. 1 mounted on an end user's circuit card 10. The power supply 100 is designed to be through-hole mounted on the end user's circuit card 10 using conventional soldering techniques. Since the end user may subject the circuit card 10 to the reflow soldering process after the power supply 100 has been mounted thereon, it would be advantageous for the power supply 100 to be able to survive the reflow soldering process. The power supply 100, therefore, employs high temperature solder. The end user's reflow temperature profile may then be set to a temperature sufficient to melt the solder between the power supply 100 and the circuit card 10, but not sufficient to melt the high temperature solder joints within the power supply 100. Further, the encapsulant 170 within the power supply 100 can cause solder displacement during solder reflow processes, resulting in component displacement.

While the use of high temperature solder will allow the power supply 100 to survive the reflow soldering process, the constituent components of the power supply 100 are necessarily subject to high temperatures during the assembly of the power supply 100 as the components are soldered to the circuit board 110. The high temperatures may degrade the functionality of the components or, in extreme cases, cause some of the components to malfunction. Therefore, what is needed in the art is a power supply module that may be manufactured using, for instance, a standard tin/lead (e.g., 60/40 or 63/37 Sn/Pb) solder composition, thus avoiding the disadvantages associated with the use of high temperature solder.

An alternative to through-hole connections is a surface mount connection. With surface mount connections, component pins do not have to penetrate holes in a circuit board. Instead, component leads are coupled to a circuit board and subjected to a reflow soldering process. One difficulty with the surface mount approach lies in the need for the power supply module to pass through the reflow soldering process as it is mounted to the end user's circuit card. The reflow soldering process can subject the power supply module to extreme stresses, possibly melting all of the power supply module's internal solder joints and possibly degrading the functionality of the constituent components of the power supply module. The electronic devices of the power supply module may shift or even decouple from the FR4 circuit board during the reflow soldering process, possibly destroying the functionality of the power supply module.

Efforts to alleviate the stresses caused by the reflow soldering process have often centered on the use of high temperature solder for the power supply module's internal solder joints. The end user's reflow temperature profile may be set to a temperature that is sufficient to melt the solder between the power supply module and the circuit card, but is too low to melt the high temperature internal solder joints. This may require special processing techniques and materials, such as employing solder and component plating to ensure high reliability. Also, it may be necessary to secure heavier components using glue or other mechanical fasteners to ensure that the components remain in place during the reflow soldering process.

FIGS. 3 and 4 illustrate an open frame power module 200 that can be surface mounted to the end user's circuit card. FIG. 3 provides an isometric view of power supply 200. The power supply 200 employs an open frame design and includes a substrate 210 (e.g., FR4) having opposing upper and lower conductive layers. The substrate 210 further has a number of vias located therethrough that provide an interconnection between the upper and lower conductive layers. The power supply 200 further includes a magnetic device 220 (e.g., a planar magnetic device) mounted on the substrate 210. The planar magnetic device 220 may be a transformer, an inductor or a combination thereof having windings formed from a portion of the conductive traces on the upper and lower layers of the substrate 210 and a core disposed through apertures of the substrate 210 and proximate the windings. The power supply 200 further includes a number of electrical components (not shown) having leads mounted on-pads formed on the upper conductive layer. The power supply 200 further includes a number of electrical components (one of which is designated 230) having leads mounted on pads (one of which is designated 250) formed on the lower conductive layer. The electrical components 230 are mounted on the substrate 210 using a standard tin/lead solder composition, located proximate the leads of the electrical components. The solder will transition to a liquid state as the power supply 200 is brought to a reflow temperature, subjecting the electrical components 230 to forces capable of detaching the electrical components 230 from the substrate 210.

The power supply 200 places small components on the lower conductive layer. The small components have a sufficiently low weight such that a surface tension of the solder is sufficient to maintain the components in contact with the lower conductive layer as the solder is subjected to a temperature sufficient to transition it to the liquid state during the reflow soldering process. Components that are too large to be held in place by the surface tension of the solder are placed on the upper conductive layer. The power supply 200, therefore, can be directly reflow soldered along with other surface mount components on an end user's circuit card. Thus, the use of glue or other mechanical fasteners to ensure that the components remain in place during the reflow soldering process is avoided.

The power supply 200 further includes a number of inter-substrate conductive mounts (one of which is designated 240) coupled to the lower conductive layer. The conductive mounts 240 are adapted to mount the power supply 200 to an end user's circuit card (or an adjacent substrate) and provide a conductive path there between. The conductive mounts 240 are composed of a material having a melting point above the solder reflow temperature. In the illustrated embodiment, the conductive mounts 240 are hollow copper balls that are plated with tin/lead and are approximately 125 mil in diameter. The copper balls illustrated are manufactured by Ball Chain Manufacturing Co. of Mount Vernon, N.Y. and by Bead Industries of Bridgeport, Conn.

FIG. 4 illustrates a side cut away view of the power supply 200 of FIG. 3. The power supply 200 is mounted to an end user's circuit card 10 using the copper balls as conductive mounts 240. Since the power supply 200 is designed to be surface mounted on the end user's circuit card 10 using a reflow soldering process, small components 230 are mounted on the lower conductive layer of the substrate 210 while larger components 270 are advantageously mounted on the upper conductive layer. The small components 230 may thus be maintained in contact with the lower conductive layer by a surface tension of the solder as the power supply 200 is subjected to the reflow soldering process.

The substrate 210 has a number of circular vias (one of which is designated 20) located therethrough that provide an interconnection between the upper and lower conductive layers. Of course, the vias 20 need not be circular. The conductive mounts 240 may be surface mounted to the substrate 210 at the vias 20. The geometric simplicity of the copper balls advantageously allows the conductive mounts 240 to be placed on the vias 20 in any orientation, the vias 20 assisting in centering or locating the conductive mounts 240 thereon. As the conductive mounts 240 are mounted to the substrate 210 of the power supply 200 by a reflow soldering process, solder may substantially fill the vias 20, providing a low impedance path through each via 20. Since the conductive mounts 240 may carry a large amount of current, the low impedance path created by the solder within the via 20 and proximate the conductive mount 240 reduces a resistive loss experienced by the power supply 200.

In any surface mount application, it is desirable to use automated equipment to pick-and-place a surface mount component. This is particularly true with a large subassembly such as the open frame power supply 200 of FIG. 3. To enable a component or subassembly to be used with pick-and-place equipment, a designer should provide a substantially flat surface that is compatible with a vacuum pick-up head of the pick-and-place equipment. More specifically, the substantially flat surface should preferably be located in the center of mass of the subassembly to properly balance the subassembly during the pick-and-place process. One way to provide the substantially flat surface is to leave an open spot (unpopulated with components) on the substrate 210 at the center of mass of the subassembly. The open spot should have sufficient clearance to accommodate the vacuum pick-up head. Leaving an open spot, however, is not conducive to improving power density. Another way to provide the substantially flat surface while improving the power density of the power supply 200 is to locate a sufficiently large component (e.g., power transistor 270) at the center of mass of the power supply 200. Since the large component 270 is placed on the substrate 210 using pick-and-place equipment, a top surface of the large component 270 is compatible with the vacuum pick-up head and may thus be employed to provide the substantially flat surface, allowing the subassembly to be compatible with the pick-and-place equipment. Alternatively, a special component whose primary purpose is to provide the substantially flat surface may be incorporated into the subassembly.

One problem not thoroughly addressed in the prior art is the need to maintain co-planarity even when there is warpage of the power module. Another problem not addressed by the prior art is the need to minimize warpage of the power module's circuit board. Addressing both problems would improve the reliability of the connection between the power module and the end user circuit card, especially when the power module is placed using a pick and place machine. An interconnect used to allow for a secure connection with a solder paste used on the end user's circuit card. Further, the tolerances between the interconnects should never exceed the thickness of even a modestly thin layer of solder paste.

SUMMARY OF THE INVENTION

The present invention relates to an improved surface mount power supply that can withstand the rigors of the manufacturing process and still create sturdy and robust connection to a user's circuit card. The open frame power module uses a U-shaped interconnect rather than a spherical interconnect. In one embodiment, the U-shaped interconnect can have a hole through one surface to allow the wicking of solder. The wicked solder provides a sturdier connection that is more likely to survive subsequent reflow processes. Further, the hole allows for degassing when the solder paste is heated. The power module is also built on a thick FR4 board. The thicker board is less likely to warp during subsequent heating. Further, a U-shaped interconnect is less likely to shift during mounting than a spherical interconnect.

The invention is a method of designing a surface mount power module that is compatible with standard customer assembly and reflow processes. The proposed invention does not require a post-lead forming process or count upon co-planarity adjustments during the customer reflow soldering operation. Furthermore, the invention does not employ a mechanical lead frame for interconnects between the power supply and the end user's circuit card.

The invention further comprises a tight-tolerance interconnect that is pick and placed during the first side power module assembly. The tight tolerance interconnect is required to ensure good lead coplanarity. The interconnect does not require a hole in either the end user's or power supply manufacturer's board which serves to conserve board real estate and eliminate coplanarity tolerance due to variations in the size of the drill hole. The power module is built on a substrate that is sufficiently thick to minimize coplanarity tolerance due to board warpage or relaxation during reflow soldering processes.

BRIEF DESCRIPTION OF THE DRAWINGS

For a more complete understanding of the present invention, reference is now made to the following descriptions taken in conjunction with the accompanying drawings, in which:

FIGS. 8A and 8B illustrate the use the conductive tracings within the FR4 circuit board and their use to increase the stiffness of the circuit card.

DETAILED DESCRIPTION OF THE DRAWINGS

Figure 1:
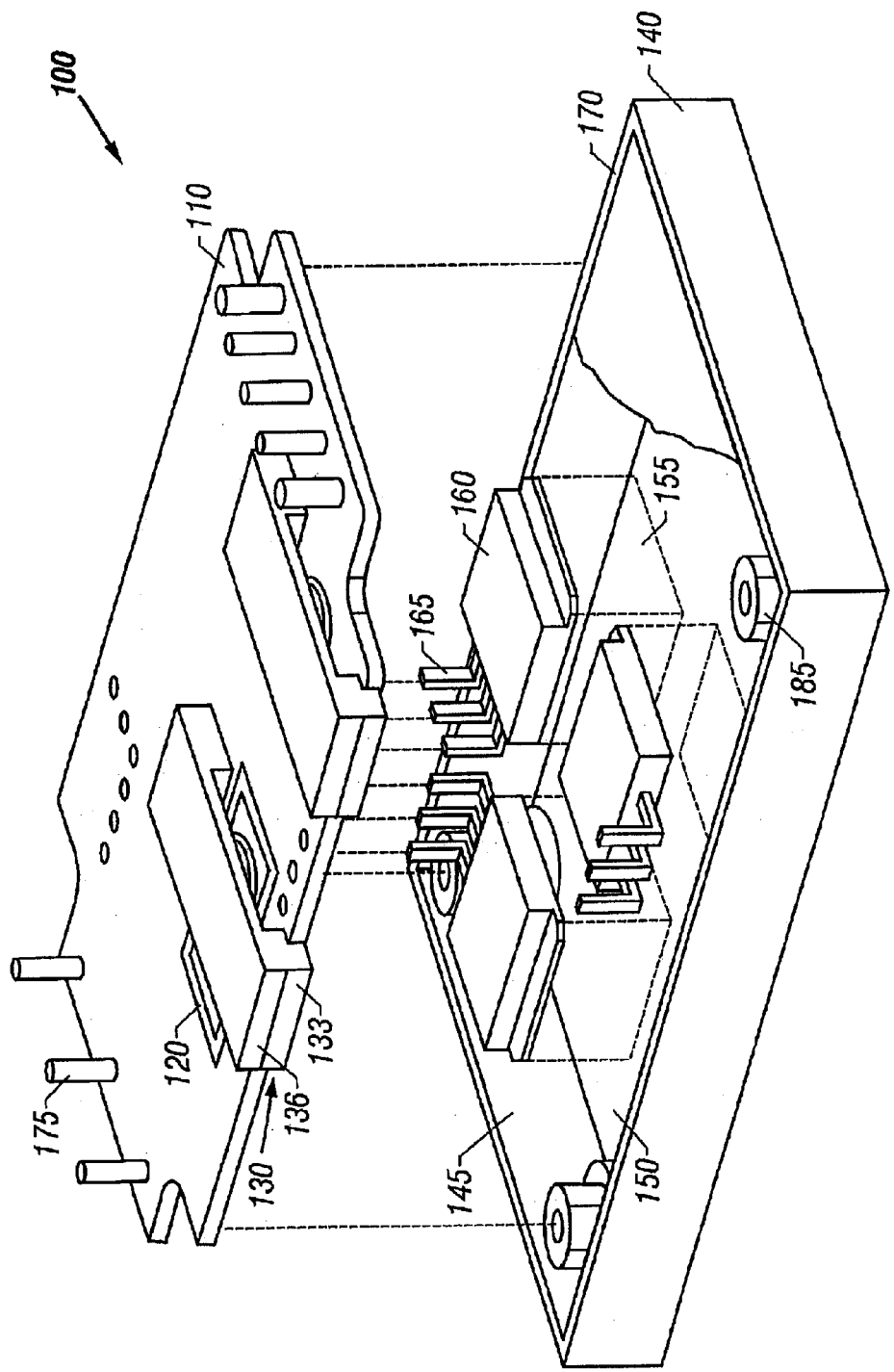
FIGS. 1 and 2 illustrate a prior art power supply with through-hole pin connections.
Figure 2:
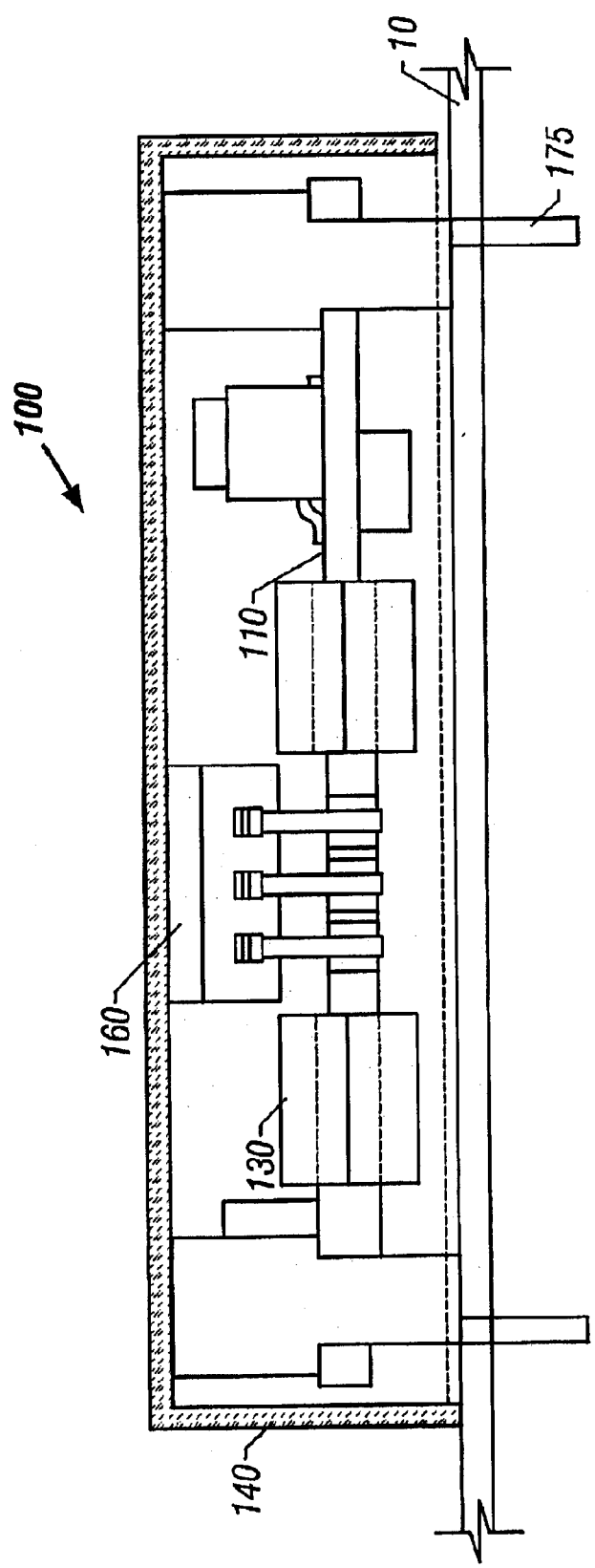
Figure 3:
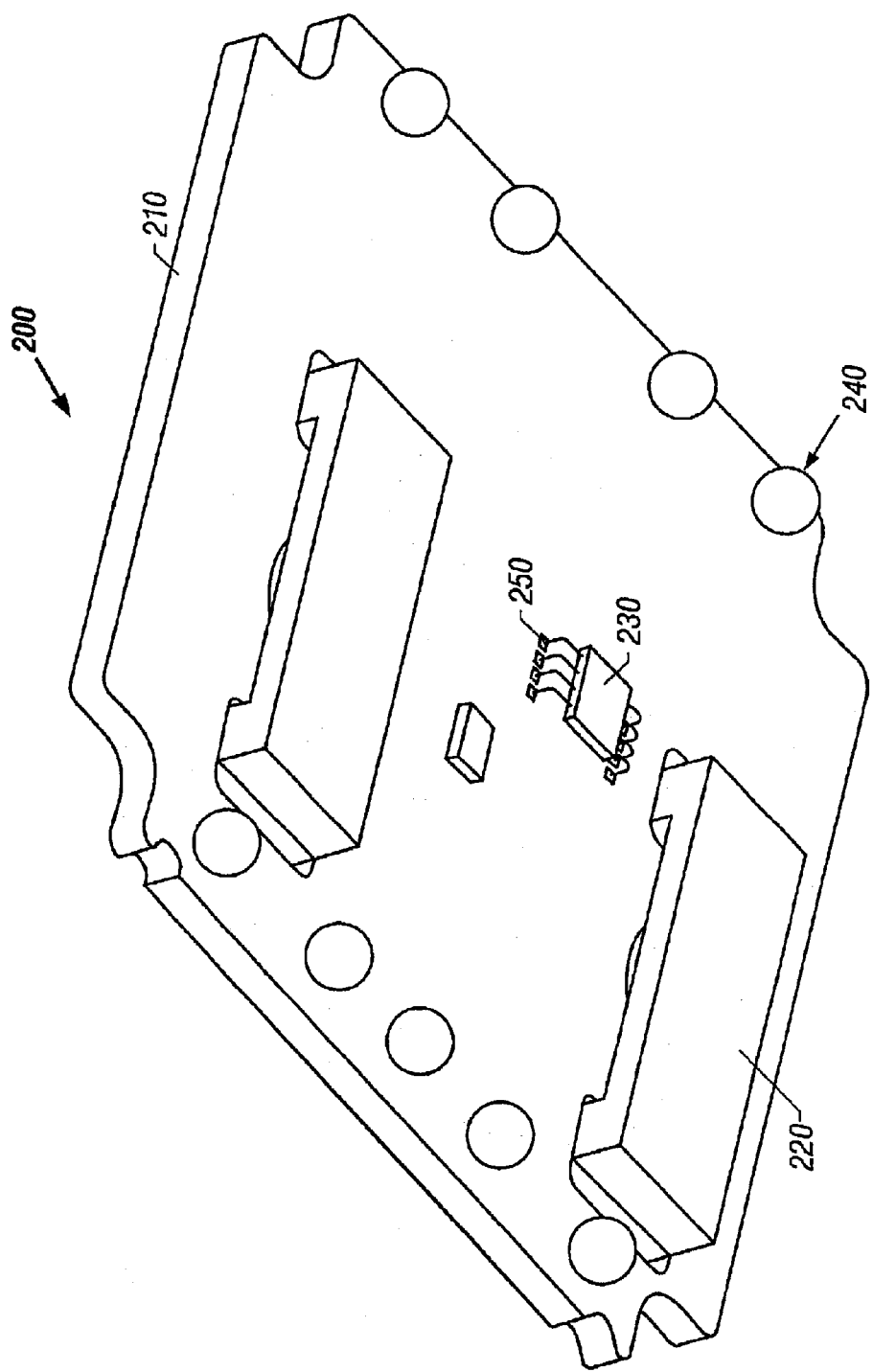
FIGS. 3 and 4 illustrate a prior art surface mount power supply.
Figure 4:
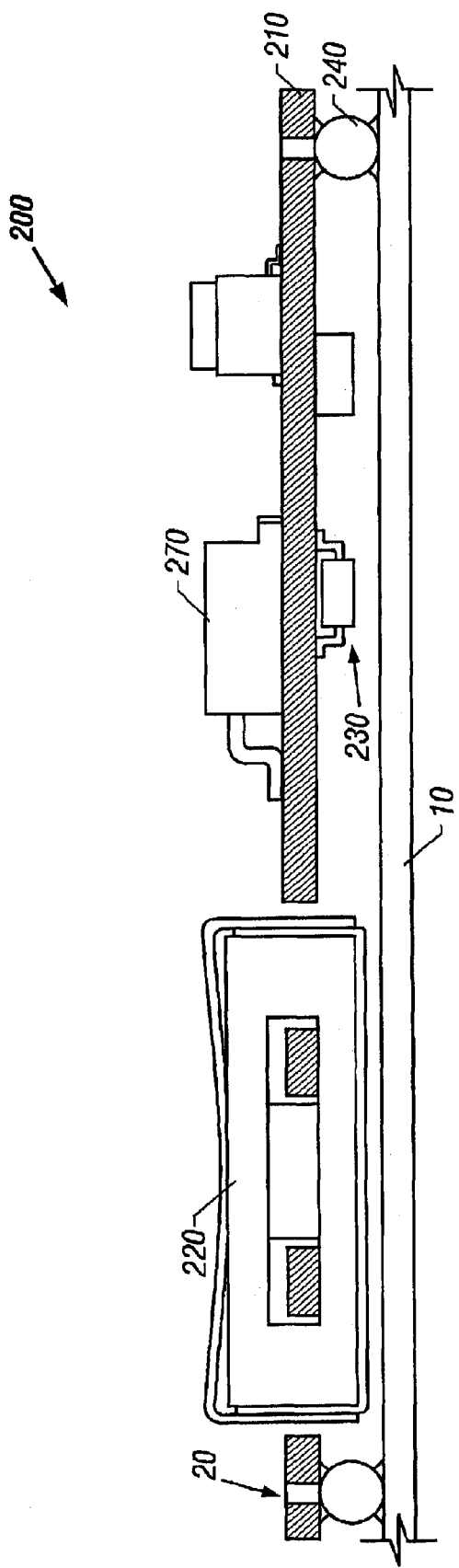
Figure 5:
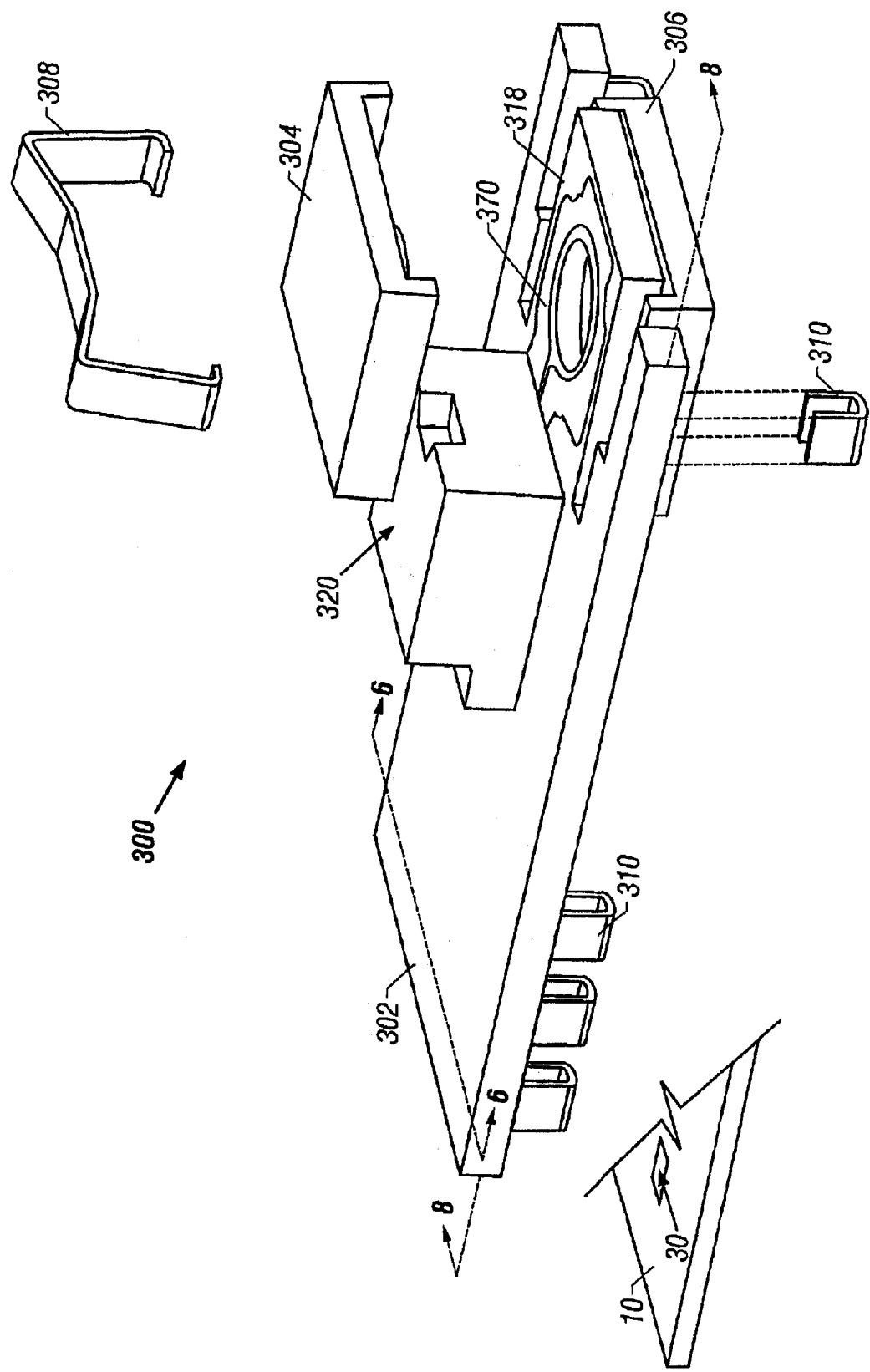
FIG. 5 illustrates a surface mount power supply in accordance with the present invention.

This invention includes both a power module assembly that addresses the deficiencies of the prior art as well as an interconnection element used to couple the power module to an end user's circuit card. FIG. 5 provides a simplified perspective view of a power module in accordance with the present invention. The power module 300 is an open frame design. Elements can be mounted on the circuit board 302. In one embodiment, the circuit board is built in multiple layers. Each layer has a conductive surface, typically a circuit pattern of copper. For example, an FR4 board can be used. A circuit pattern is etched onto each layer, and then the layers are placed on top of each other with vertical conductive paths between the layers. Each layer might be approximately 6–8 mils in thickness. Thus, a twelve layer board might be approximately 80 mils in thickness.

In one embodiment, the circuit board 302 is sufficiently thick to minimize coplanarity tolerance due to board warpage or relaxation during the reflow soldering process. For example, the board might be between 60 and 100 mils in thickness, and preferably 80 mils in thickness. At temperatures of approximately 210 degrees Celsius, a board of this thickness will warp less than 1 to 2 mils per inch of board from a centerline. In preparing the circuit tracings on each level of the board 302, a maximum amount of copper is left on each layer to increase the stiffness of the board, and thus its resistance to warpage. Substantially equal amounts of copper on each layer also contribute to minimizing warpage.

A pair of planar magnetic cores 304 and 306 engage the circuit board 302 generally at aperture 318. The planar cores 304, 306 can be held in place by clip 308. Element 320 can act as a suitable surface for a pick and place machine. A winding can be etched on the exposed surfaces of aperture 318. The windings can be part of a circuit that interacts with the planar magnetic cores 304, 306.

A plurality of interconnects 310 can be placed on one side of the circuit board and be used for coupling the power module 300 to the end user circuit card 10. A plurality of mounting pads 30 are located on the circuit card 10. A solder paste is placed on these pads 30 and the interconnects 310 are then placed onto the solder paste. Heat is applied that melts the solder past and allows it to flow around the interconnect. Upon cooling, the solder paste freezes thereby coupling the interconnect to the conductive mounting pad 30.

Figure 6A:
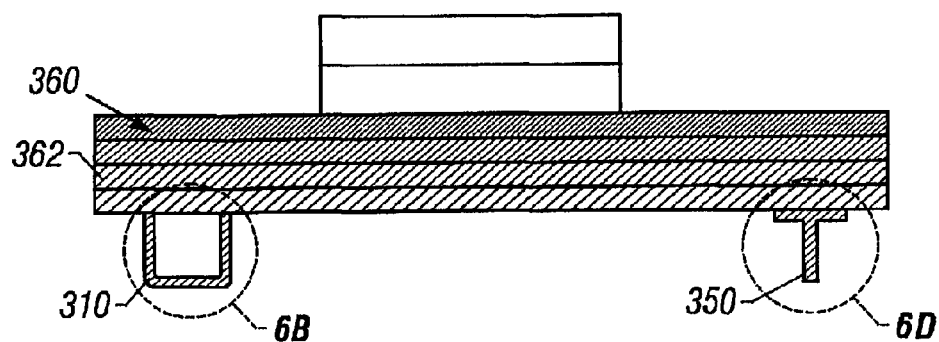
FIGS. 6A to 6D provide detailed views of the interconnects of the present invention.
Figure 6B:
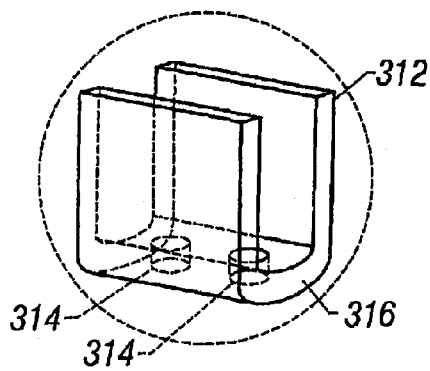
Figure 6D:
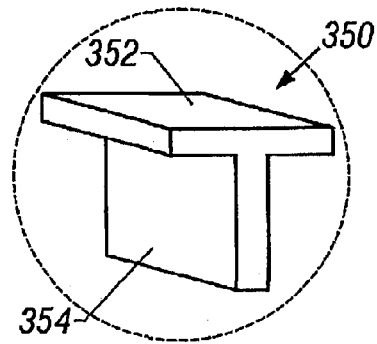
Figure 6C:
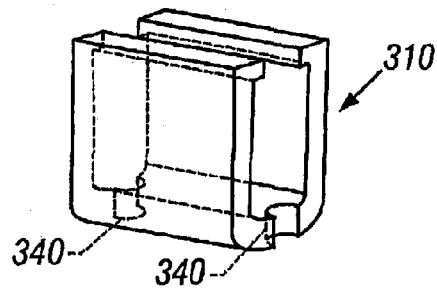

FIGS. 6A and 6B provide additional detail of one embodiment of the interconnects 310. As mentioned above, the board can be made of multiple layers of individually etched circuits. For example, layers 360 and 362 can each have a conductive layer on one side. This layer can be selectively etched to form a portion of the overall power module circuit. The interconnect 310 acts as a lead for that circuit, allowing the power module to power the end user's circuit card. Alternatively, one or more of the interconnects can simply be used to support the power module in a spaced apart position from the end user circuit card 10. The interconnect 310 is generally U-shaped with at least one side wall 312 and a contact surface 316. In one embodiment, the contact surface 316 can have at least one hole 314 there through. The hole 314 allows solder paste to flow into the interconnect and form a stronger physical bond. Also, the hole 314 allows for degassing from the solder paste. However, the present invention includes a U-shaped interconnect with or without hole 314. Alternatively, side slots 340 as shown in FIG. 6C can be used. Alternatively, a T-shaped interconnect 350 can be used as shown in FIG. 6D. The T-shaped interconnect can have a contact surface 352 that is coupled to board 300 and a prong 354 that contacts the solder past 40. A U-shaped interconnect could also be used with a T-shaped interconnect.

Figure 7:
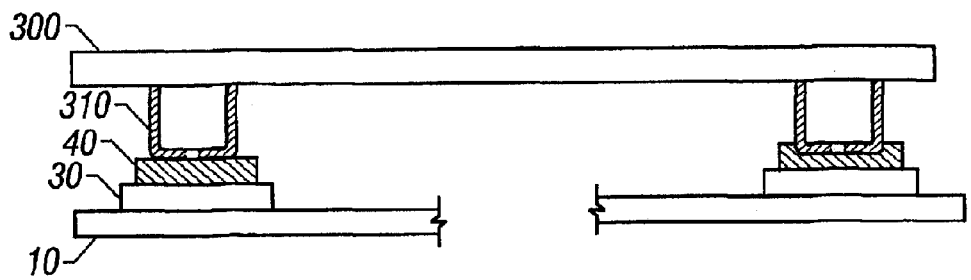
FIG. 7 shows the connection between the interconnects of the present invention and a solder paste placed on the end user's circuit card.

While shown as a perfectly flat board, power module 300 usually is not. Uneven heating of the board during solder reflow processes can cause the board to warp slightly, perhaps by only a few mils. Likewise, the interconnects 310 should also be of equal and precise height, but variations can occur due to manufacturing inconsistencies. Further, the end user board 10 should be perfectly flat, but is rarely so. In sum, there are tolerances that must be addressed to ensure that each interconnect 310 makes positive and sustainable contact with the card 10. A solder paste 40 is placed on mounting pads 30. Errors in the dimensions and shapes of the board 302, interconnect 310, or card 10, can be subsumed within the depth of the solder paste 40. In other words, once the interconnects are mounted to the board 302, the contact surfaces 316 should all fall within the same plane. However, an error, such as seen in FIG. 7, results in one surface 316 being closer to the board 10. This error can be tolerated within the depth of the solder paste which is generally pliable and can conform around the interconnect 310.

Figure 8A:
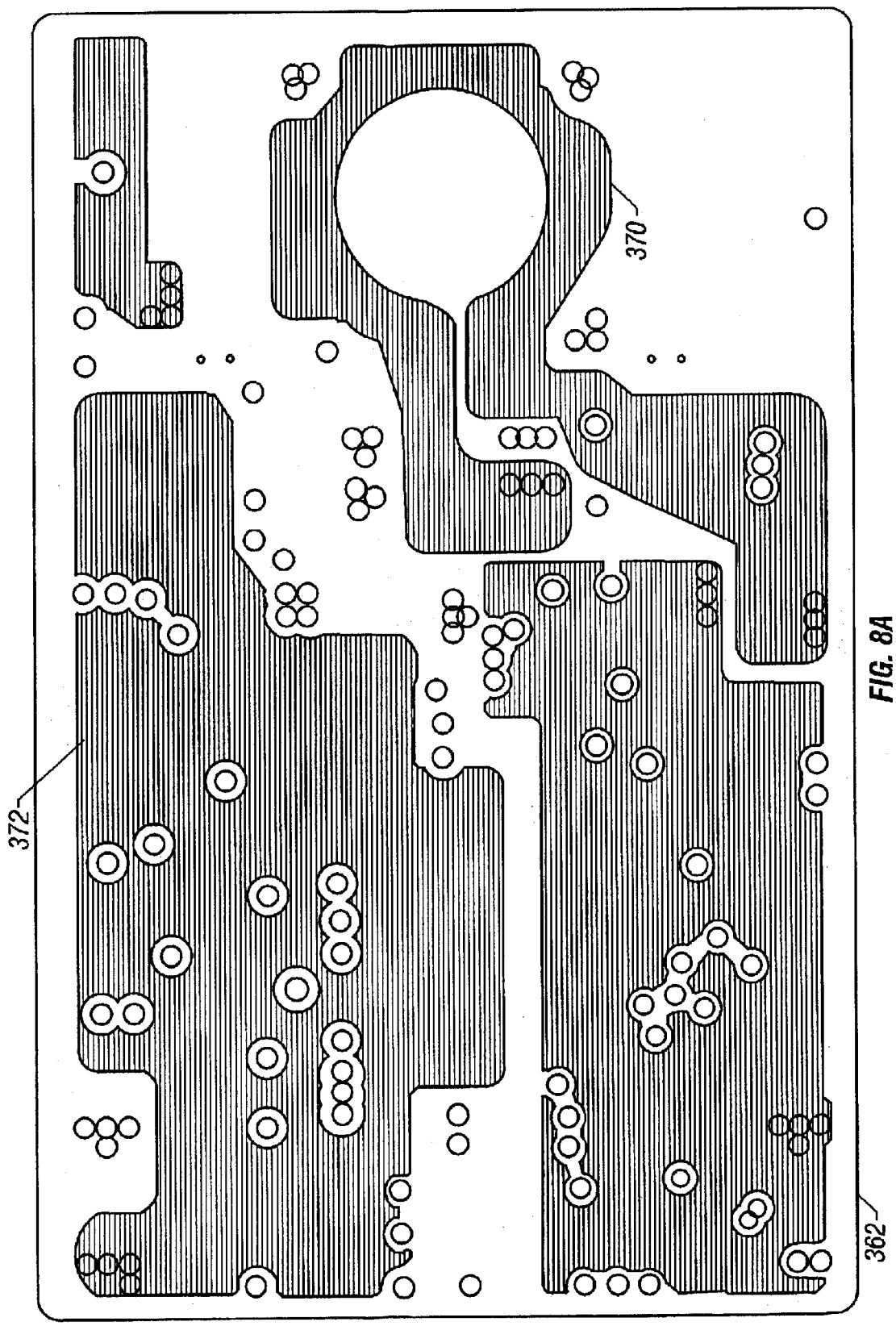

FIGS. 8A and 8B illustrate the use the conductive tracings within the FR4 circuit board. The raw FR4 board includes a complete layer of copper cladding. A photo-resist can be applied to the copper and an image of the etch pattern is shined on the photo-resist. The areas exposed to light resist exposure and the unilluminated areas do not. The unilluminated areas are then rinsed removing the unexposed photo-resist and the copper beneath it. Layer 362 and 364 are shown. Layer 362 can have a winding pattern 370 as well as large expanses of copper. Likewise, layer 360, shown in FIG. 8B, can also have a winding pattern 380 and large expanses of copper 382. As mentioned above, it is advantageous to leave as much copper on the layer as possible to increase the stiffness of the board 302. Another advantage of leaving excess copper on each layer is that during heating and cooling, the thermal expansions forces experienced by the copper are balanced by those on each layer.

Those skilled in the art should understand that the previously described embodiments of the surface mountable power supply and related methods are submitted for illustrative purposes only and other embodiments thereof capable of surviving reflow are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. For a better understanding of a variety of power converter topologies employing discrete and integrated magnetic techniques, see Modern DC-to-DC Switchmode Power Converter Circuits, by Rudolph P. Severns and Gordon Bloom, Van Nostrand Reinhold Company, New York, N.Y. (1985); and Principles of Power Electronics, by John G. Kassakian, Martin F. Schlect and George C. Verghese, Addison-Wesley Publishing Company, Reading, Mass. (1991). The above-listed references are incorporated herein by reference in their entirety.

Although the present invention has been described in detail, those skilled in the art should understand that they can make various changes, substitutions and alterations herein without departing from the spirit and scope of the invention in its broadest form.

We claim:

1. A power module comprising:
   (a) a board having at least one element mounted thereon; and
   (b) at least one interconnect for electrically coupling the element to an end user's circuit card, wherein the interconnect is U-shaped, the interconnect further comprising a contact surface having a through hole, said through hole adapted to allow solder paste to flow into the interconnect to form a strong physical bond between the element and the end user's circuit card.

2. The power module of claim 1 wherein said interconnect further comprises a conductive structure having a sidewall.

3. The power module of claim 1 wherein said board is formed from a plurality of layers.

4. The power module of claim 1 wherein said board is formed of Fr4.

5. The power module of claim 1 wherein said power module further comprises a circuit formed on a plurality of layers.

6. The power module of claim 1 wherein said board further comprises a surface for engagement with a pick and plane machine.

7. The power module of claim 1 wherein said at least one element is a pair of planar magnetic cores.

8. The power module of claim 1 wherein said board is stiffened by a metallic layer within the board.

9. The power module of claim 1 wherein said at least one interconnect comprises three interconnects that are placed to form a stable plane.

10. The power module of claim 1 wherein a solder paste is used to couple the interconnect to the end user circuit card.

11. The power module of claim 10 wherein a thickness of said solder paste is greater than a combined tolerance of the board, the interconnect, and the end user circuit card.

12. An interconnect for use between a power module and an end user circuit card comprising:
   (a) a first sidewall;
   (b) a contact surface adapted to contact said end user circuit card, said contact surface having at least one through hole, said through hole adapted to flow of solder paste into the interconnect; and
   (c) a second side wall, wherein the interconnect is generally U-shaped and conductive.

13. The interconnect of claim 12 wherein the height of the first and second sidewalls are approximately identical.

14. The interconnect of claim 12 wherein the height of the first and second sidewalls are within 2 mils of each other.

15. A method of coupling a power module to an end-user circuit board comprising the steps of:
   (a) applying a solder paste to at least one mounting pad on said circuit board;
   (b) placing a power module having at least one U-shaped interconnect onto the circuit board so that the interconnect contact to solder paste; wherein the solder paste flows through holes in the interconnect; and wherein a tolerance between the interconnect is absorbed in the solder paste; and
   (c) heating the solder paste.

16. The method of claim 15, wherein step (b) further comprises placing a power module having at least three U-shaped interconnects.

* * * * *